(12) United States Patent
Mansueto (10) Patent No.: US 7,021,729 B2
(45) Date of Patent: Apr. 4, 2006

(54) DEVICE MOUNTING AND RETENTION ASSEMBLY

(75) Inventor: Richard Mansueto, Laguna Hills, CA (US)

(73) Assignee: Gateway Inc., Irvine, CA (US)

( * ) Notice: Subject to any disclaimer, the term of this patent is extended or adjusted under 35 U.S.C. 154(b) by 0 days.

(21) Appl. No.: 10/347,969

(22) Filed: Jan. 21, 2003

(65) Prior Publication Data

US 2003/0222555 A1    Dec. 4, 2003

Related U.S. Application Data

(62) Division of application No. 09/416,547, filed on Oct. 12, 1999, now Pat. No. 6,619,766.

(51) Int. Cl.
*A47B 97/00* (2006.01)

(52) U.S. Cl. .................................. 312/223.1; 312/330.1

(58) Field of Classification Search ............. 312/223.1, 312/223.2, 330.1, 333, 334.1, 334.7; 361/684, 361/685, 807
See application file for complete search history.

(56) References Cited

U.S. PATENT DOCUMENTS

| | | | | |
|---|---|---|---|---|
| 676,157 A | * | 6/1901 | Sparks | ........................ 312/119 |
| 1,321,859 A | * | 11/1919 | Streich | ................... 312/334.22 |
| 3,160,448 A | * | 12/1964 | Abernathy et al. | ............ 384/23 |
| 4,694,408 A | * | 9/1987 | Zaleski | ......................... 701/33 |
| 5,423,697 A | * | 6/1995 | MacGregor | ................. 439/638 |
| 5,530,531 A | * | 6/1996 | Girard | ......................... 399/120 |

FOREIGN PATENT DOCUMENTS

EP        443492    * 8/1991

* cited by examiner

*Primary Examiner*—James O. Hansen
(74) *Attorney, Agent, or Firm*—Jeffrey A. Proehl; Woods, Fuller, Shultz & Smith (57) ABSTRACT

A device mounting and retention mechanism is disclosed, comprising a guide disposed on a device so that the guide is capable of slidably moving along a guide channel so that a retention mechanism may engage the guide thereby providing a restraining force and ground for the device. A device retention assembly is also disclosed, comprising a guide mounted on a device so that the guide is capable of slidably moving along a guide channel disposed on a housing so that the retention mechanism is capable of flexibly engaging the guide, thereby providing a restraining force. A device mounting assembly is also disclosed, comprising a first guide mounted on a device and a second guide mounted on a device wherein a guide channel is formed so as to selectively accept the first guide and exclude the second guide.

18 Claims, 10 Drawing Sheets

FIG. 9

DEVICE MOUNTING AND RETENTION ASSEMBLY

RELATED APPLICATIONS

The present application is a divisional of U.S. patent application Ser. No. 09/416,547, entitled "Device Mounting and Retention Assembly," filed on Oct. 12, 1999.

FIELD OF THE INVENTION

The present invention generally relates to the field of mounting assemblies, and particularly to device mounting and retention assemblies.

BACKGROUND OF THE INVENTION

In the past, devices such as hard disk drives and other components were mounted in a housing such as in an information handling system or convergence system, etc. by using screws to attach the device to holes contained on the housing. This method is time-consuming, expensive, and inefficient. To install or replace a device in a housing necessitated locating and removing all retaining screws, then manually replacing the screws to install a new device. Other methods intended to address this problem involve complicated retention systems. Some systems involve complicated parts that are incapable of selectively permitting the removal of a device, while retaining other devices contained in the housing. Other systems include trays that prevent efficient distribution of heat and/or fail to provide a suitable ground for the device.

It is the intention of the present invention to present an improved device retention assembly. By mounting guides capable of sliding through a guide channel, the device may be installed or removed more efficiently. The guides may be shaped as posts and mounted in mounting holes contained on the device to further simplify the structure. A retention mechanism disposed on the housing may engage the guide therein providing a restraining force to provide stability and prevent removal of the device. The retention mechanism may be formed in a more simplified manner, thereby lowering production costs. For example, the retention mechanism may be formed as one piece mounted to the housing. Furthermore, the retention mechanism may be formed as an integral part of the housing, so the housing and retention mechanism may be formed in one process. In this way, the invention provides a simplified mounting and retention structure with electrical grounding capabilities. By forming the retention mechanism in the complementary shape of a guide, the retention mechanism may selectively engage a particular guide, thereby promoting correct orientation and complete installation of the device.

Additionally, a guide channel may be formed in the complementary shape of a guide so as to selectively allow movement of the particular guide through the guide channel, yet exclude other guides from entering the guide channel. The guide channel may also be strategically located to promote proper front-to-back installation of the device. The guide channel may also have a complementary size, such as width or height, to selectively allow movement of a particular guide through the guide channel, yet exclude other guides from entering the channel. In this way, the invention may promote the proper installation of the device in the housing and specialize different positions in a housing for different devices.

For the foregoing reasons, there is a need for a device mounting and retention assembly that may facilitate the efficient and correct orientation of a device for installation and removal.

SUMMARY OF THE INVENTION

The present invention is directed to a device mounting and retention assembly comprising a guide disposed on a device wherein the guide is capable of slidably moving along a guide channel so a retention mechanism may engage the guide thereby providing a restraining force and ground for the device.

The present invention is further directed to a device retention assembly comprising a guide mounted on a device wherein the guide is capable of slidably moving along a guide channel disposed on a housing so the retention mechanism is capable of flexibly engaging the guide, thereby providing a restraining force.

The present invention is further directed to a device mounting assembly comprising a first guide mounted on a device and a second guide mounted on a device wherein a guide channel is formed so as to selectively accept the first guide and exclude the second guide.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiment of the invention, an example of which is illustrated in the accompanying drawings.

A variety of devices, such as electronic devices, are mounted in information handling systems and convergence systems, etc. to add the functionality of the device to the system. However, past mounting methods often involved complicated processes of manufacture and assembly. In some cases, the device had to be mounted to the system by using screws. Other types of systems that have attempted to address this problem involved components that must also be assembled and installed in the desired system. The present invention addresses these problems by forming a simplified retention mechanism that may be capable of providing an electrical ground for the device. This invention may be useful in a variety of applications such as server assemblies, hard-drive arrays, personal computers, or any other system where space and convenience of operation is a concern.

Figure 1:
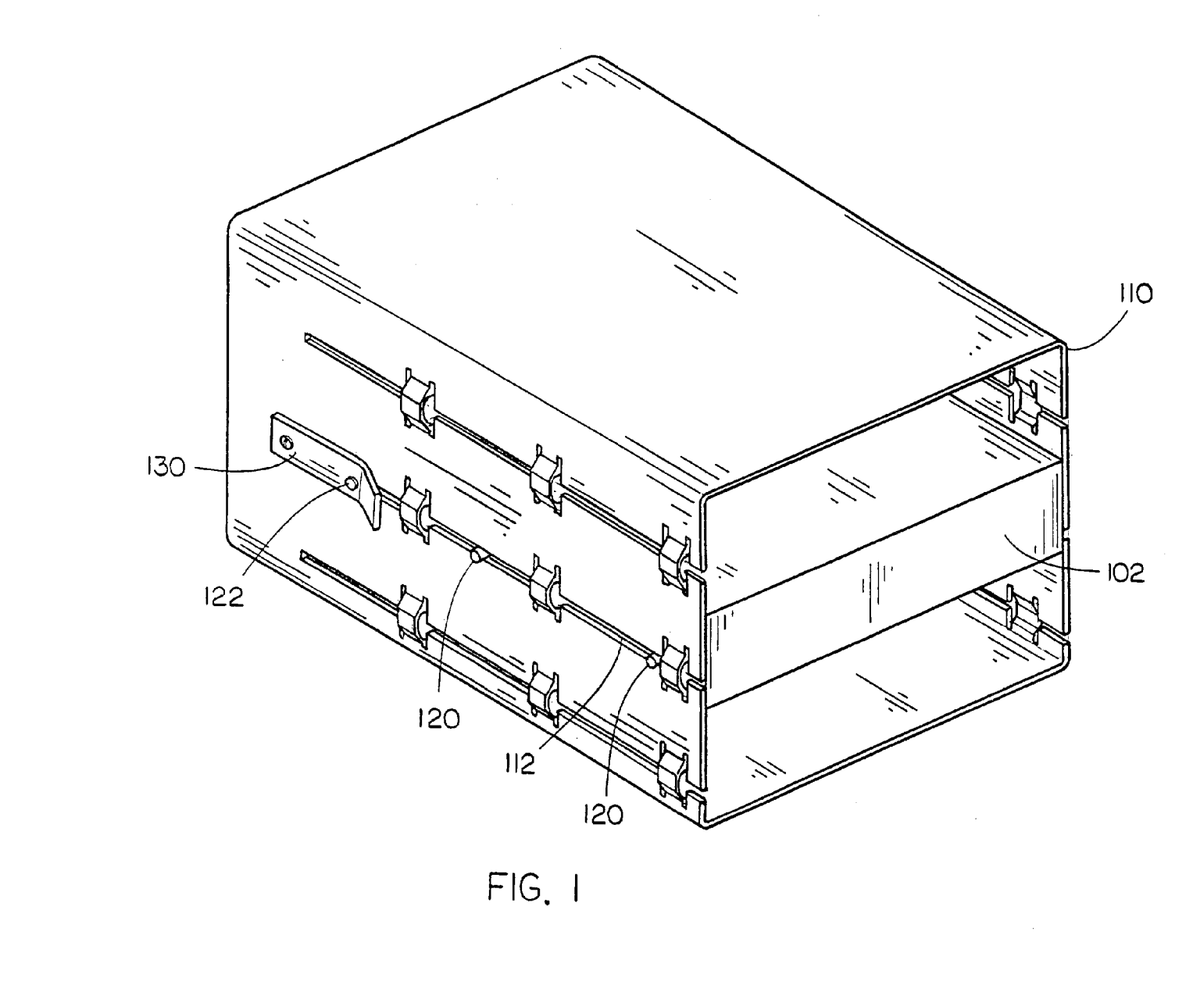
FIG. 1 is an isometric view of an exemplary embodiment of the present invention.

In FIG. 1, an exemplary embodiment of the present invention is shown. A device 102 is mounted in a housing 110. A plurality of guides 120 allow the device 102 to slide along a guide channel 112 formed on the housing 110. A retention mechanism 130 is also disposed on the housing 110. The retention mechanism 130 engages a guide 122 thereby providing a restraining force to selectively prevent removal of the device 102. The retention mechanism may also provide an electrical ground by engaging the guide 122 on the device 102. In this embodiment, a plurality of guides 120 may be installed on the device 102 economically, yet provide the capability of slidably installing and removing the device 102 along the guide channels 112 on the housing 110. By forming the guides 120 in this manner, the device 102 has a greater surface area exposed, thereby increasing the efficiency of heat distribution. For example, it may be preferable to locate a cooling fan (not shown) near the housing 110 so the device may be cooled more efficiently. Additionally, the retention mechanism 130 may be formed to selectively engage the guide 122, and therefore the device 102, for ease of removal. For example, the retention mechanism 130 may be manually flexed so as to disengage the retention mechanism 130 from the guide 122. This allows the device 102 to be slidably removed through the guide channel 112, thereby releasing the device 102 from the housing 110.

Figure 2A:
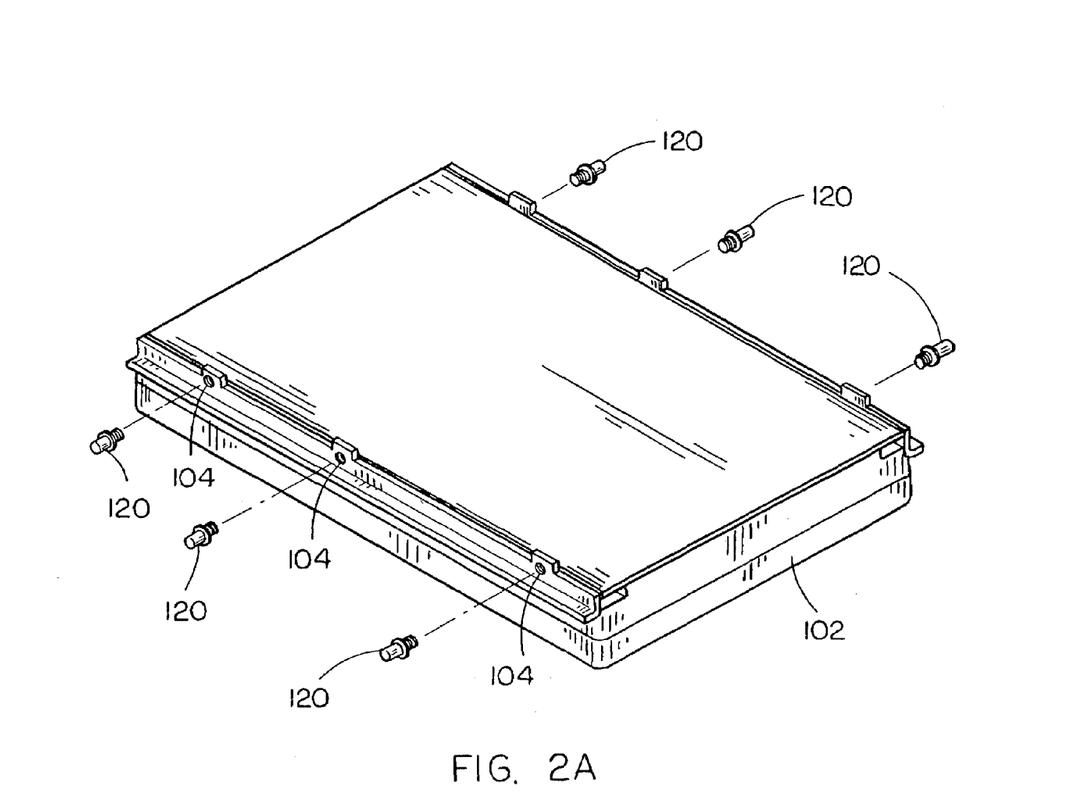
FIG. 2A is an exploded view of a device.
Figure 2B:
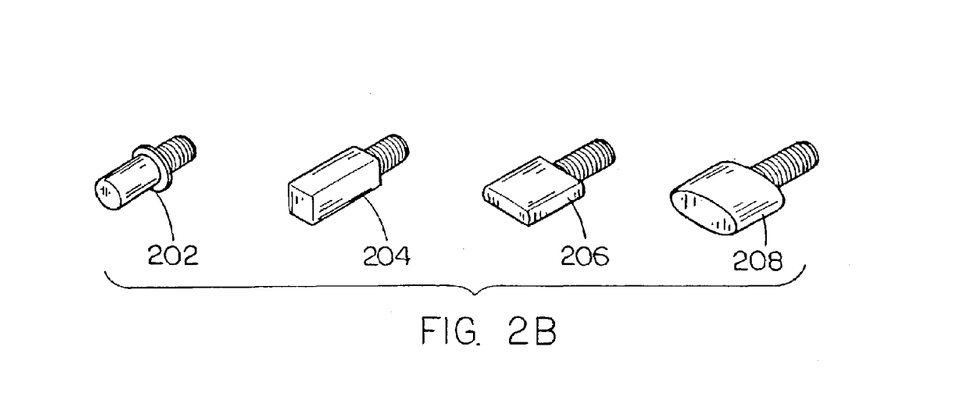
FIGS. 2B and 2C depict exemplary guides capable of being utilized by the present invention.
Figure 2C:
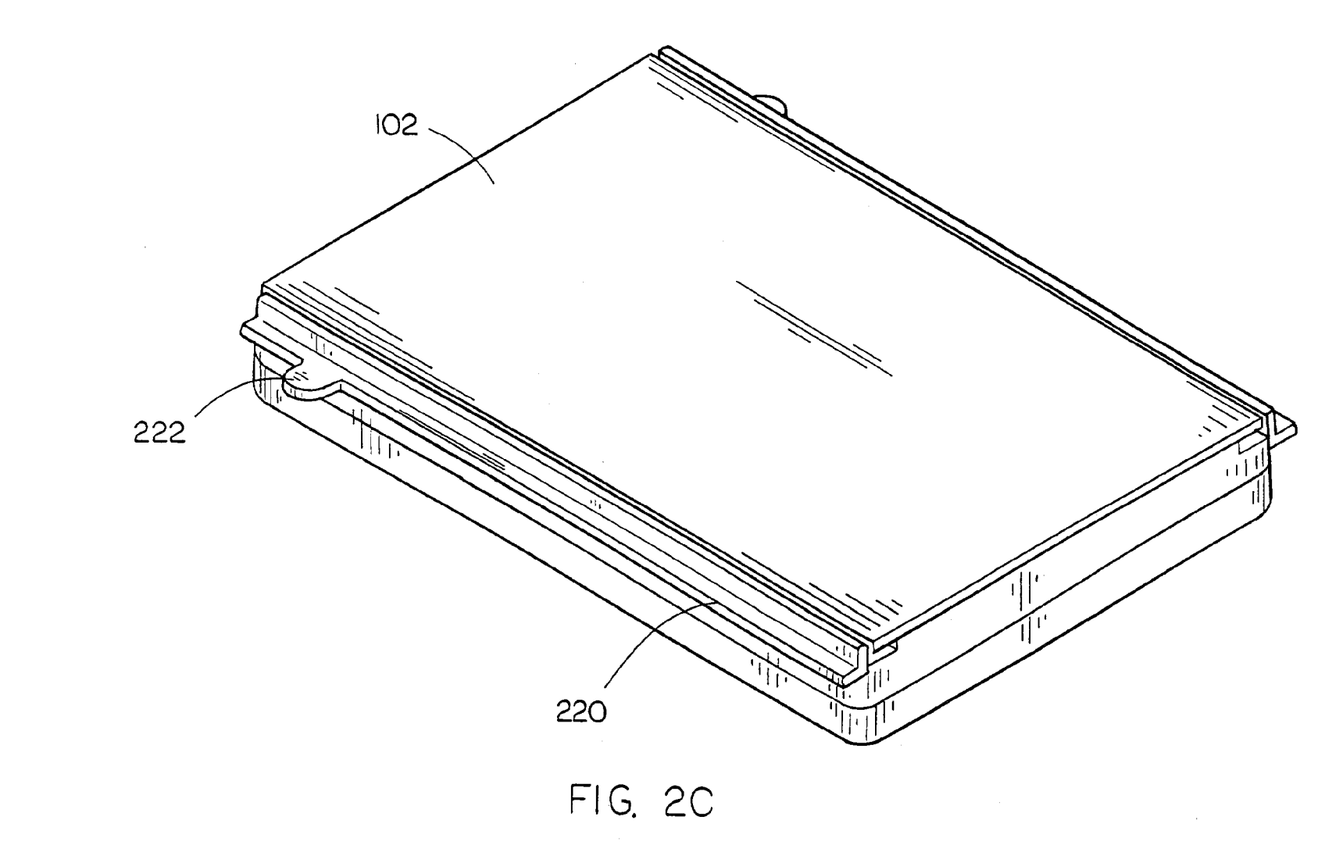

There are a variety of guides that may be utilized by the present invention. In an exemplary embodiment, as shown in FIG. 2A, a plurality of guides 120 may be mounted on the device with the use of mounting holes 104 contained on the device 102. As shown in FIG. 2B, the guides may be substantially circular 202, square 204, substantially flat 206, substantially rounded 208 or any other shape that permits the device 102 to slide along the guide channel 112 (FIG. 1). Guides 120 may also be formed as an integral part of the device 102 (FIGS. 1, 2A, and 4) itself, thereby eliminating the need for an additional attachment step in a manufacturing process. Furthermore, the guide may be formed as a rail, as shown in FIG. 2C. In this example, the guide 120a is formed so as to slide along a guide channel 112 (FIG. 1). The guide may include a protrusion 122a so that the retention mechanism 130 may engage the protrusion 122a, thereby providing a restraining force on the device 102 (FIG. 1). Alternatively, it might be preferable to forgo the use of a protrusion by utilizing pressure applied by the retention mechanism directly against the guide. The retention mechanism 130 may also provide an electrical ground for the device 102 (FIG. 1). Although the invention, and particularly the types of guides able to be utilized by the invention have been described with a certain degree of particularity, it should be recognized that elements thereof may be altered by persons skilled in the art without departing from the spirit and scope of the invention.

Figure 3A:
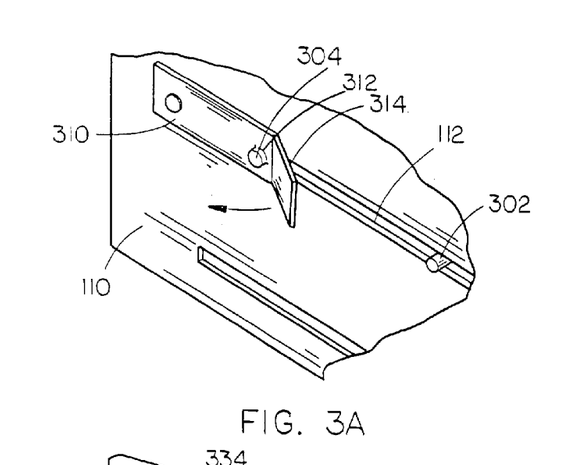
FIGS. 3A, 3B, 3C, and 3D are views of various retention mechanisms capable of being utilized by the present invention.

Referring now to FIGS. 3A through 3D, examples of various types of retention mechanisms that may be utilized by the present invention are shown. In FIG. 3A, the retention mechanism 130 is formed as a spring. The retention mechanism 130 includes a securing portion 132 to selectively engage the guide 122. The securing portion 132 may be formed as an indentation as in the present example or other complementary shape of a guide 122 wherein a greater restraining force may be achieved with the guide 122 so that the device 102 is better restrained. The securing portion may also be formed in any other form one of ordinary skill may substitute so as to engage the guide. It might be preferable to include a release portion 134 on the retention mechanism to ease device removal and installation. The release portion 134 may aid in flexing the retention mechanism 130 away from the guide 122 so as to disengage the device. It might be preferable to curve the release portion 134 away from the housing so that the retention mechanism 130 may automatically flex when a force is applied by a guide 122 against the retention mechanism 130 as the device 102 is slidably inserted along the guide channel 112. A securing portion 132 of the retention mechanism 130 may then automatically engage the guide 122, thereby providing a securing force. This enables the device 102 to be installed and mounted in a housing 110 in one quick and fluid motion. The retention mechanism 130 may also serve as a ground for the device 102. The retention mechanism may be disengaged from the guide by flexing the mechanism 130 away from the guide 122 with the use of a release portion 134 included on the mechanism 130. Once the guide 122 is disengaged from the retention mechanism 130, the device is free to slide along the guide channel 112 utilizing the guides 122 and 120 for the removal of the device 102 (FIGS. 1 and 4). These steps may be reversed to install the device.

Figure 3B:
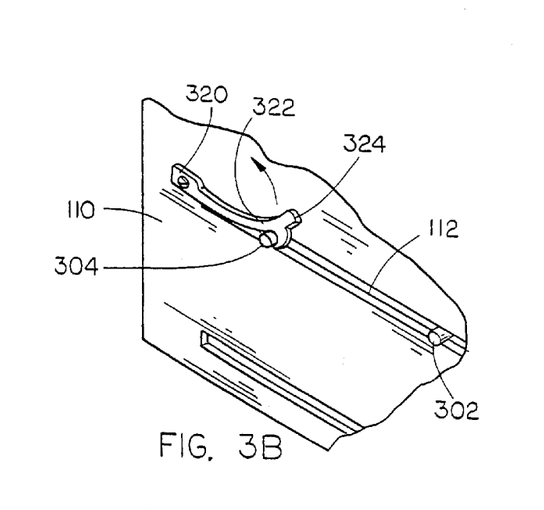
Figure 4:
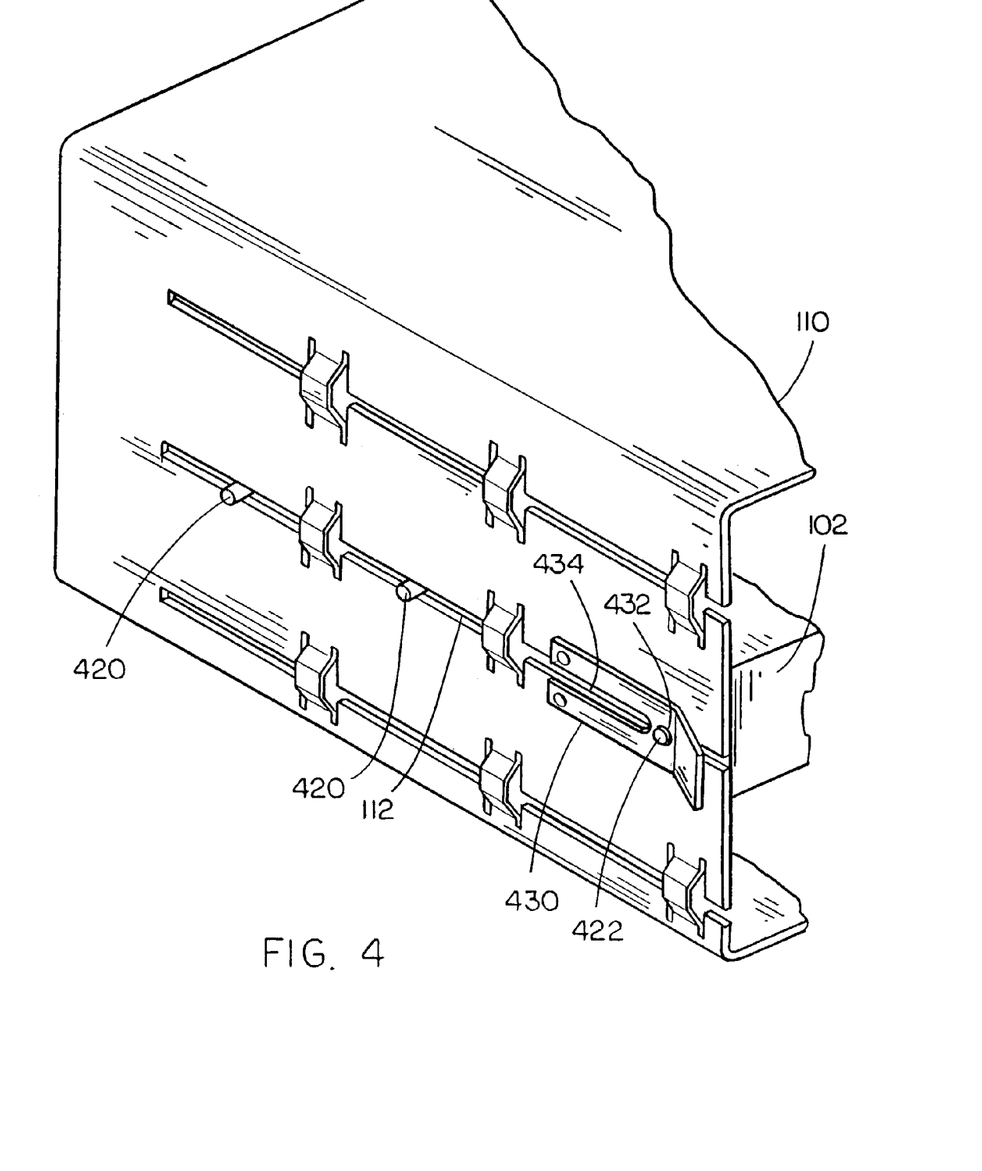
FIG. 4 is an isometric drawing of an exemplary embodiment of the present invention with a retention mechanism mounted at the insertion point of the housing.

In FIG. 3B, the retention mechanism 130b has a substantially hook-like structure. The retention mechanism 130b includes a securing portion 136 to engage a guide 122. In this example, the retention mechanism 130 flexes substantially parallel to the housing 110 to engage and disengage the guide 122. This embodiment may be particularly useful for mounting the retention mechanism 130b near the entry point for the device 102 (FIG. 4) to allow a plurality of guides 120 and 122 to pass along the guide channel 112 uninterrupted. The retention mechanism 130b may include a release portion 134b to aid in disengaging the retention mechanism 130b from the guide 122.

Figure 3C:
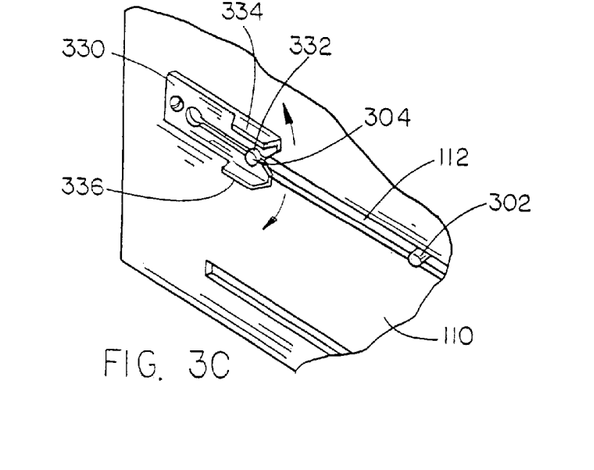

In FIG. 3C, two grasping portions, a first grasping member 140 and a second grasping member 142 form the retention mechanism 130c. These members are disposed on the housing 110 so as to be able to engage a guide 122 slidably moving along a guide channel 112. The first grasping member 140 and the second grasping member 142 are capable of flexible movement so as to permit entry of the guide 122. Once the guide 122 reaches the securing portion 132c formed by indentations in the grasping members, the first grasping member 140 and the second grasping member 142 may return to their original position thereby providing a restraining force on the guide 122.

Figure 3D:
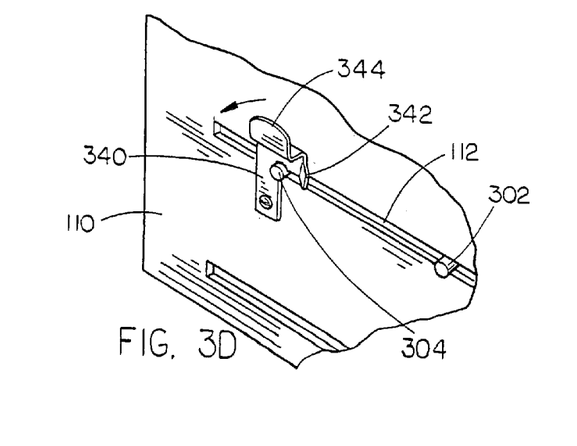

In FIG. 3D, another type of retention mechanism is shown. In this example, the retention mechanism 130d is formed so that a release portion 154 may be utilized to flex the retention mechanism 130d away from the housing 110. The retention mechanism 130d also includes a portion 152 so that the retention mechanism 130d may be flexed when a guide sliding along a guide channel 112 applies pressure so that the retention mechanism 130d may engage the guide 122. It should be recognized that the retention mechanism may be altered by persons or ordinary skill in the art without departing from the spirit and scope of the invention.

A retention mechanism 430 may be mounted anywhere along the guide channel 112 yet still provide a restraining force and electrical grounding capabilities, as shown in FIG. 4. In this exemplary embodiment a retention mechanism 430 is mounted toward the insertion point of a device 102. The retention mechanism 430 includes a securing portion 432 so a plurality of guides 420 may pass along the guide channel 112 of the housing 110 unimpeded by the retention mechanism 430. The retention mechanism 430 may be formed so as to allow a plurality of guides 420 to pass, for instance through a channel 434 formed in the retention mechanism 430, yet retain a specific guide 422 to secure the device 102 in the housing 110. By mounting the retention mechanism 430 toward the insertion point of the housing 110, less exposure of the housing is needed to utilize the retention mechanism 430 so as to engage and release the device 102.

Figure 5A:
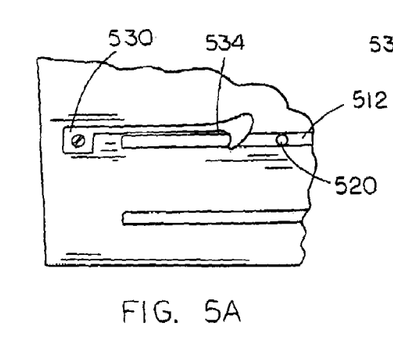
FIGS. 5A, 5B, and 5C are progressive views of an exemplary embodiment of the present invention.
Figure 5B:
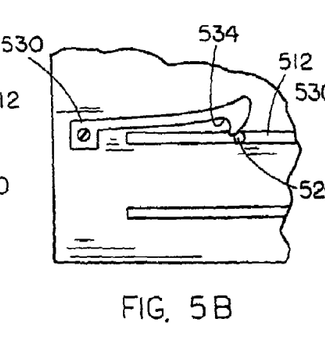
Figure 5C:
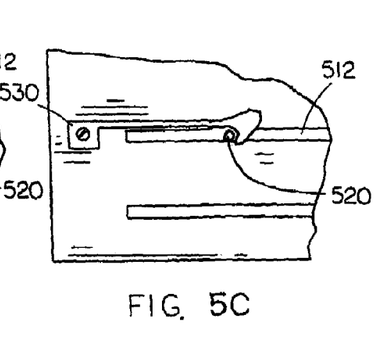

Referring now to FIGS. 5A, 5B, and 5C a progressive view of the operation of an exemplary retention mechanism is shown. In FIG. 5A, a retention mechanism 530 is shown disposed next to a guide channel 512. A guide 520 mounted on a device, (not shown) slides along the guide channel 512 toward the retention mechanism 520. In FIG. 5B, the guide 520 makes initial contact with the retention mechanism 530 causing the guide to flex away from the guide channel 512 so as to allow the guide 520 to continue along the guide channel 512. Finally, in FIG. 5C, the guide 520 has passed the retention mechanism, allowing the retention mechanism to flex toward its original position. A securing portion 534 of the retention mechanism 530 engages the guide 520, thereby preventing movement of the guide 520 along the guide channel 512. The retention mechanism may also serve as a ground for the device 102 (FIGS. 1 and 4) by contacting the guide 520.

Figure 6:
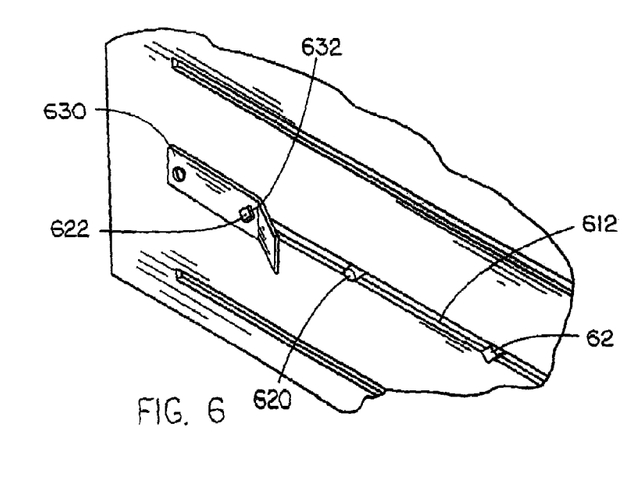
FIG. 6 is a view of an exemplary retention mechanism capable of selectively engaging a guide.

Referring now to FIG. 6, the retention mechanism is capable of selectively retaining a specific guide. The retention mechanism 630 is formed so that only a specific guide may fit into the securing portion 632 of the mechanism 630. The securing portion may be formed, for example, as a hole, indentation, cavity, or as any other type of structure capable of engaging a guide 622. In this example, the securing portion 632 is formed so that it is capable of engaging a specific guide 622 while enabling nonconforming guides 620 to continue past the retention mechanism 630. This embodiment is particularly useful when mounting the retention mechanism toward the entry point for the device 102 (FIG. 4). The securing portion 632 may be formed in a variety of shapes, sizes, and orientations so as to selectively engage a specific guide. For example, the securing portion may be formed so as to receive a smaller guide while allowing larger guides to pass. In this way, the retention mechanism 630 will only allow the device 102 to be retained when correctly oriented in the housing 110 (FIG. 4). This also promotes the complete installation of the device 102 because the retention mechanism 630 will engage the specific guide 622 only when the device 102 is completely inserted.

Figure 7:
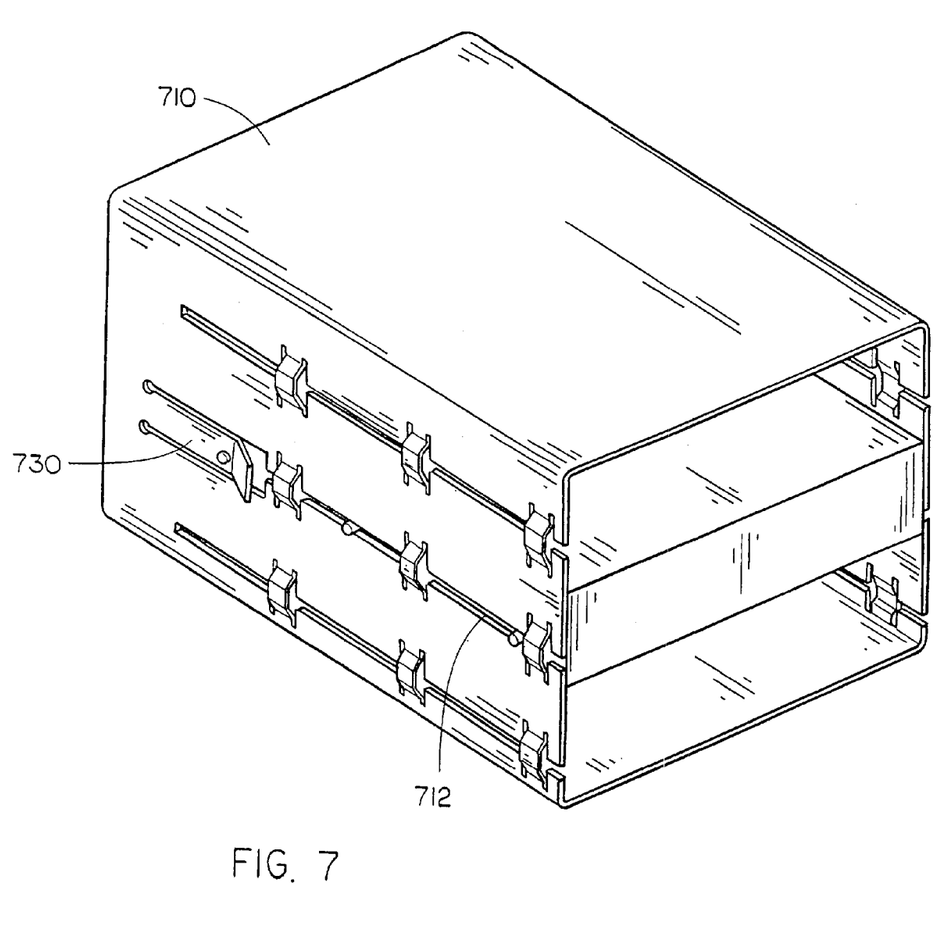
FIG. 7 is a view of an exemplary retention mechanism formed as an integral part of a housing.

The retention mechanism may be formed as an integral part of the housing, as shown in FIG. 7. In this exemplary embodiment, the retention mechanism 730 may be formed in the same manufacturing process as the housing 710 and/or guide channel 712. In this way, the retention mechanism 730 is formed without having to add another step in production and manufacturing processes. By eliminating the need for an extra manufacturing step, the device may be made more efficiently, thereby improving the marketability of the device. As stated above, the guide may also be formed as an integral part of the housing, further lowering production and manufacturing costs. Combining both of these features will further add to the efficiency of the manufacturing process, resulting in lower costs to both manufacturer and consumer.

Figure 8A:
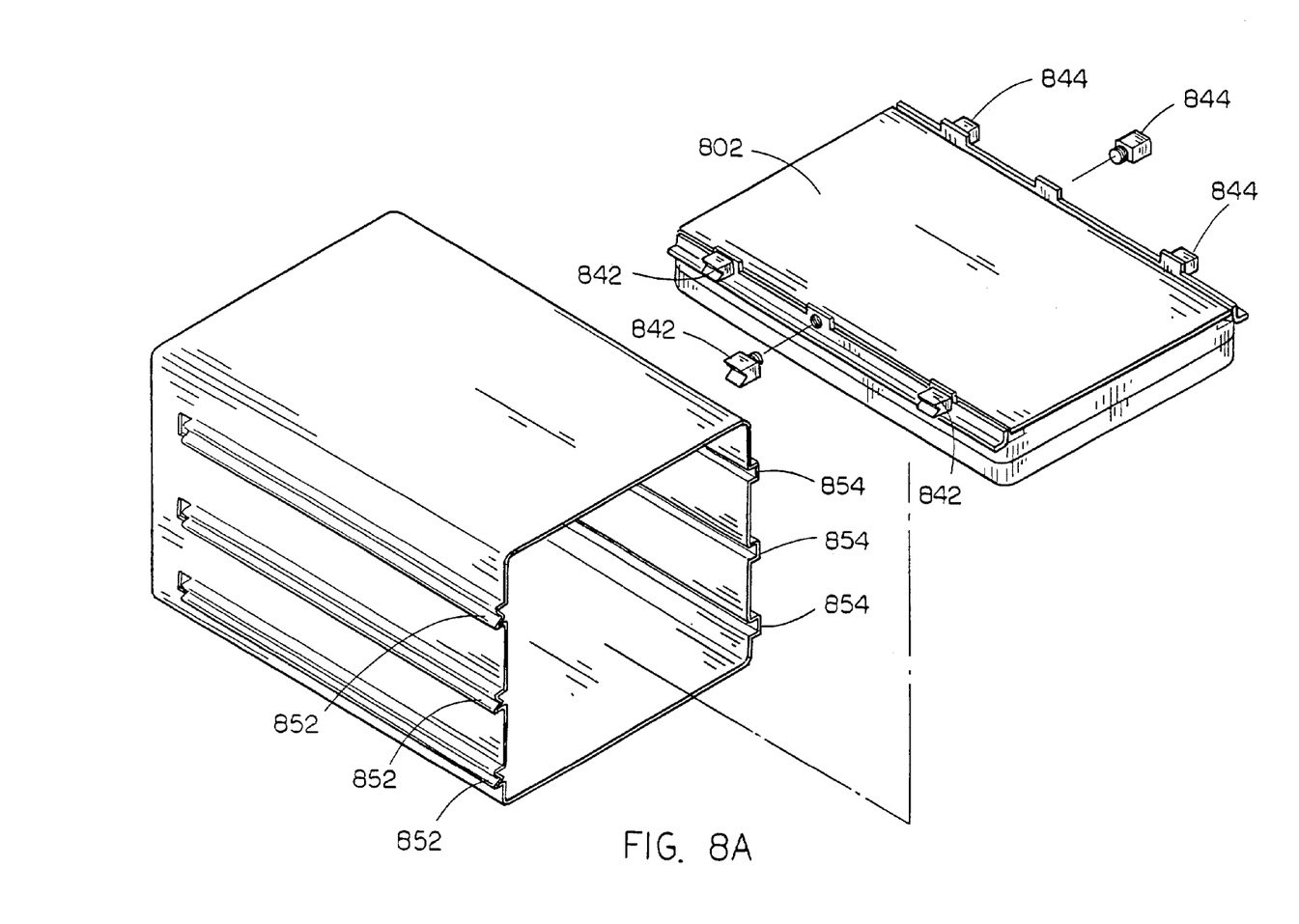
FIGS. 8A, 8B, 8C, and 8D are views of an exemplary embodiment of the present invention wherein the guide channels are formed to selectively engage a guide.
Figure 8B:
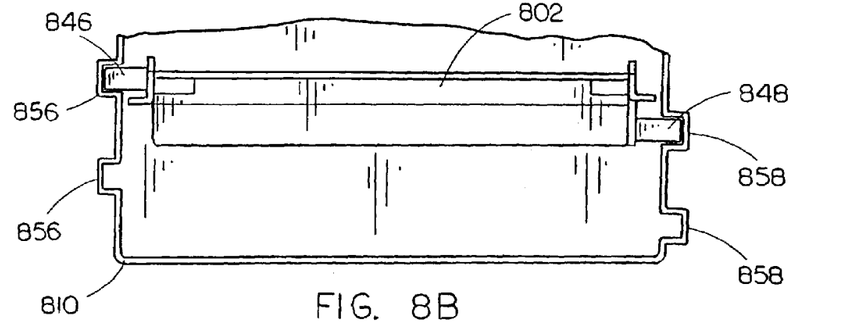
Figure 8C:
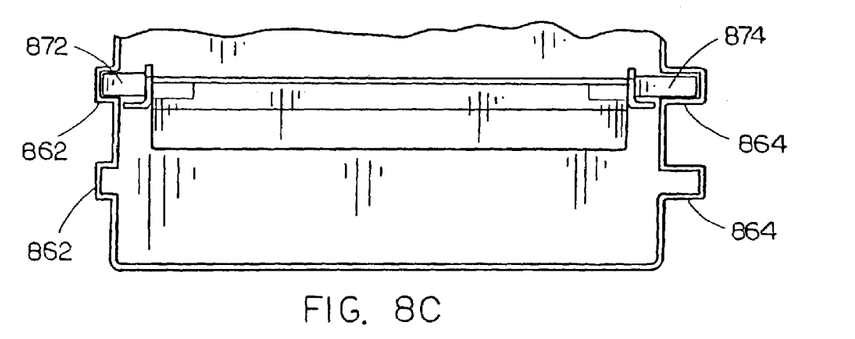
Figure 8D:
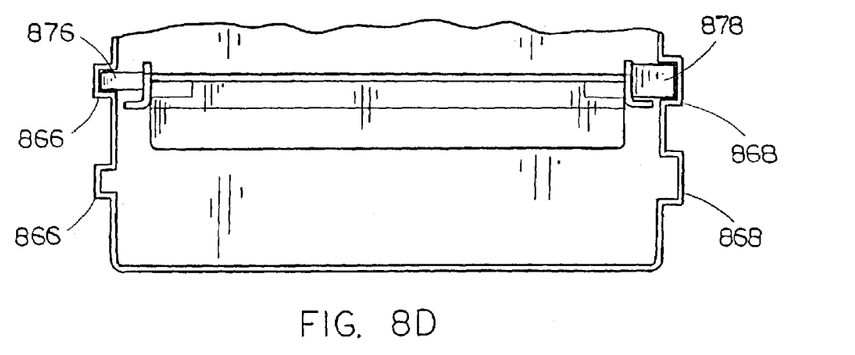

Referring now to FIGS. 8A through 8D another exemplary embodiment of the present invention is shown. In the following descriptions, front is meant to mean the entry point in a housing, for example, the front of a device as inserted into a housing as shown in FIG. 1. Back is meant to mean the opposite end of the housing from the entry point. Height is meant to mean a perpendicular orientation to the entry point and housing, for example, different heights of guides and guide channels are shown in FIGS. 8B and 8D. Width is defined as perpendicular to height and parallel to the housing, for example, different widths of guides and guide channels are shown in FIG. 8C.

As shown in FIG. 8A, guide channels may be formed so as to promote the proper insertion and orientation of a device. A first guide 842 may be mounted on a device 802 so that the first guide 842 corresponds with the first guide channel 852 and the second guide 844 corresponds with the second guide channel 854. A first guide 842 may be formed in a complementary shape of a first guide channel 852 so that the first guide 842 may be inserted into the first guide channel 852, yet prevent the insertion of a second guide 844 into the first guide channel 852. In this way, the device 802 may only be inserted in the desired manner. In FIG. 8B, the first guide channel 856 and second guide channel 858 are strategically placed in the housing 810 so that the first guide 846 and second guide 848 may promote proper front-to-back orientation of the device 802. Using this arrangement alone, the first guide channel 856 may accept both the first guide 846 and second guide 848, and the second guide channel 858 may accept both the first guide 846 and second guide 848 yet still work to promote the proper front-to-back orientation of the device. Utilizing this arrangement alone, it is possible to insert the device in two different orientations that bias the front of the device 802 toward the front of the housing 810 and the back of the device 802 toward the back of the housing 810. In FIG. 8C, the width of a first guide 872 and first guide channel 862 is varied so that first guide will fit into a first guide channel 862 and exclude a second guide 874 from the first guide channel 862. The height of the guide may also be adjusted to promote proper orientation of the device. In FIG. 8D, the height of a first guide 876 and first guide channel 866 are adjusted so the first guide channel 866 may accept the first guide 876 and exclude the second guide 878 from insertion into the first guide channel 866. Both guide channels may be formed so as to selectively permit and restrict access yet not depart from the present invention. It should be recognized that the guides and guide channels thereof may be altered by persons of ordinary skill in the art without departing from the spirit and scope of the invention.

Figure 9:
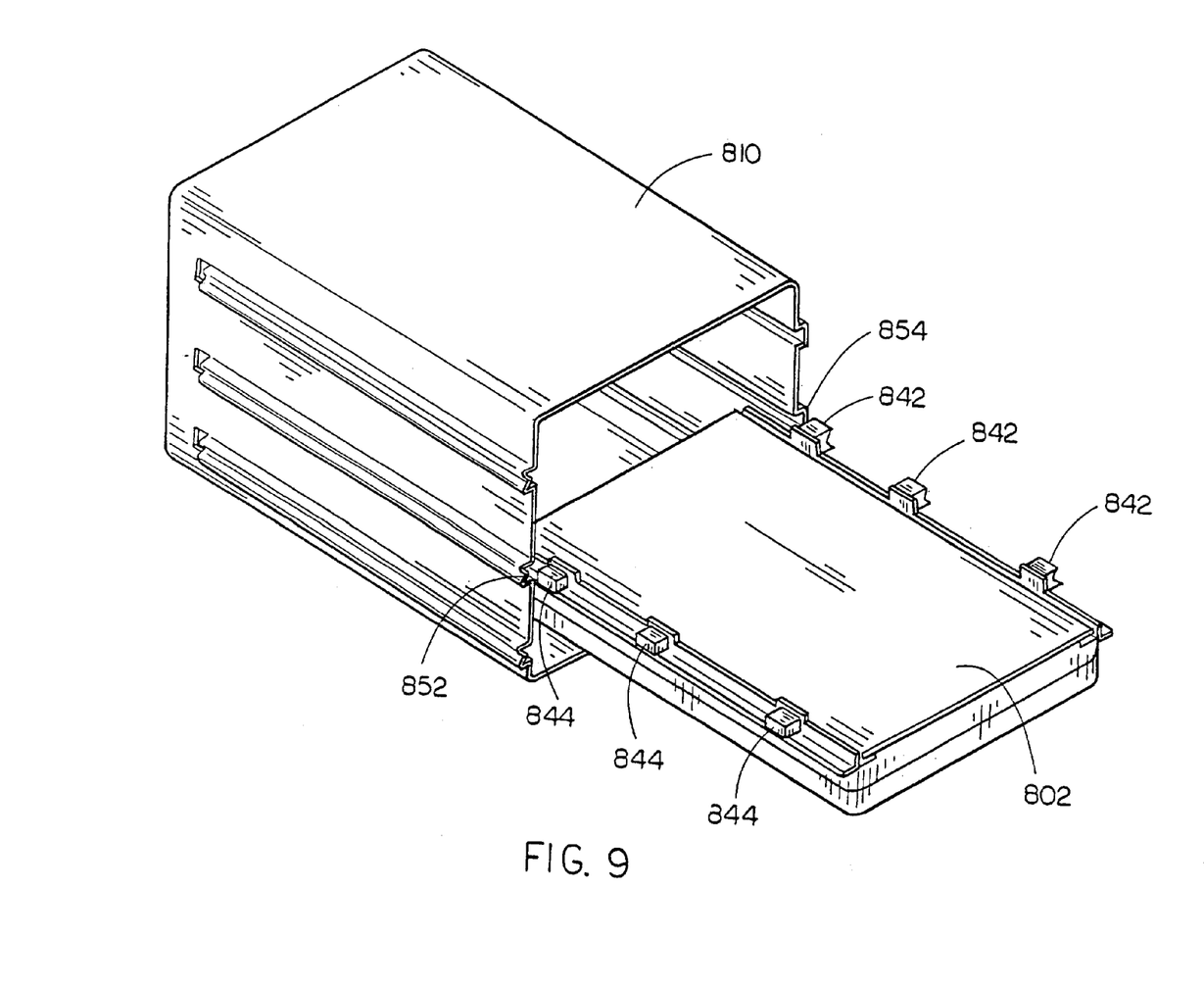
FIG. 9 shows an exemplary embodiment of the present invention wherein the guide channel is formed to selectively prevent the insertion of a guide so as to promote the correct installation of a device.

Referring now to FIG. 9, an attempted incorrect insertion of a device 802 is shown so that the first guide channel 852 is matched up with a second guide 844. The first guide channel 852 may employ any restrictive technique so that the device may not be installed in that orientation. For example, the first guide channel 852 may be formed so as to complement the first guide by variances in height, width, shape, orientation on the device 802, etc. to restrict the wrongful insertion of the device 802. Furthermore, the first guide and second guide may be disposed on different devices (not shown) so only the correct device may be inserted in the guide channel. For instance, if the first guide was mounted on a hard disk drive, and second guide was connected to a CD-ROM device, it might be desirable to restrict the insertion of the devices to certain positions in the housing. To achieve this goal, the first guide channel may be formed so as to accept the first guide, in this instance connected to the hard disk drive, and exclude all other guides so that only this device may be inserted into that position in the housing. Additionally, the second guide channel may be formed so as to accept second guide, in this instance connected to a CD-ROM device, and exclude all other guides and their attached devices from being installed in that position in the housing.

It is believed that the device mounting and retention mechanism of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A system, comprising:
    a disk drive device;
    a housing with an interior for receiving the disk drive device; and
    a device mounting assembly for removably mounting the disk drive device on the housing, comprising:
    a first guide mounted on the disk drive device;
    a second guide mounted on the disk drive device;
    a first guide channel disposed on a first side wall of the housing in communication with the interior of the housing; and,
    a second guide channel disposed on a second side wall of the housing in communication with the interior of the housing, said second guide channel being located on the second side wall of the housing in a substantially opposed orientation to the first guide channel on the first side wall of the housing;
    wherein the first guide channel is formed so as to selectively accept the first guide and exclude the second guide;
    wherein the second guide channel is formed so as to selectively accept the second guide and exclude the first guide.

2. The system as described in claim 1, wherein the first guide and second guide are formed as an integral part of the disk drive device.

3. The system as described in claim 1, wherein the first guide channel is formed in a complementary shape of the first guide.

4. The system as described in claim 1, wherein the first guide channel is formed in a complementary size of the first guide.

5. The system as described in claim 4, wherein the first guide channel is formed in a complementary width of the first guide.

6. The system as described in claim 4, wherein the first guide channel is formed in a complementary height of the first guide.

7. The system as described in claim 1, wherein the housing is configured to be capable of at least substantially containing the disk drive device.

8. The system as described in claim 1, wherein the first and second guides each have a protrusion length defined by a distance that each of the first and second guides protrudes from the disk drive device, and each of the first and second guide channels has a depth in a respective one of the side walls, and wherein the depth of the first guide channel is less than the protrusion length of the first guide to space the disk drive device from the housing, and the depth of the second channel guide is less than the protrusion length of the second guide to space the first device from the housing.

9. The system as described in claim 1, wherein the first guide has a first end surface with a first end configuration, wherein a first base surface of the first guide channel has a first face configuration, the first end configuration and the first face configuration being complementary to permit substantially snug abutment of the first end surface against the first base surface; and
    wherein the second guide has a second end surface with a second end configuration, wherein a second base surface of the second guide channel has a second face configuration, the second end configuration and the second face configuration being complementary to permit substantially snug abutment of the second end surface against the second base surface.

10. The system as described in claim 9, wherein the first end configuration of the first end surface of the first guide is incapable of snugly abutting the second face configuration of the second base surface of the second guide channel, and the second end configuration of the second end surface of the second guide is incapable of snugly abutting the first face configuration of the first base surface of the first guide channel.

11. The system as described in claim 1, wherein the disk drive device comprises a hard disk drive device.

12. The system as described in claim 1, wherein the housing comprises a cage positioned in a personal computer.

13. A system, comprising:
    a disk drive device;
    a housing with an interior for receiving the disk drive device; and
    a device mounting assembly for removably mounting the disk drive device on the housing, comprising:
    a first guide means for guiding the disk drive device, the first guide means being formed as an integral part of the disk drive device;
    a second guide means for guiding the disk drive device, the second guide means being formed as an integral part of the disk drive device;
    a first receiving means for receiving one or more guide means, the first receiving means being disposed on a first side wall of the housing in communication with the interior of the housing;
    a second receiving means for receiving one or more guide means, the second receiving means being disposed on a second side wall of the housing in communication with the interior of the housing, said second guide channel being located on the second side wall of the housing in a substantially opposed orientation to the first guide channel on the first side wall of the housing;
    wherein the first receiving means is formed so as to selectively accept the first guide means and exclude the second guide means;
    wherein the second receiving means is formed so as to selectively accept the second guide means and exclude the first guide means.

14. The device mounting assembly as described in claim 13, wherein the first guide means and second guide means are disposed on the disk drive device.

15. The system as described in claim 13, wherein the first receiving means is formed in a complementary shape of the first guide means so as to selectively accept the first guide means and exclude the second guide means.

16. The system as described in claim 13, wherein the first receiving means is formed in a complementary size of the first guide means so as to selectively accept the first guide and exclude the second guide.

17. The system as described in claim 16, wherein the first receiving means is formed in a complementary width of the first guide means so as to selectively accept the first guide means and exclude the second guide means.

18. The system as described in claim 16, wherein the first receiving means is formed in a complementary height of the first guide means so as to selectively accept the first guide means and exclude the second guide means.

* * * * *